(12) United States Patent
Curcio et al.

(10) Patent No.: US 6,638,607 B1
(45) Date of Patent: Oct. 28, 2003

(54) METHOD AND STRUCTURE FOR PRODUCING Z-AXIS INTERCONNECTION ASSEMBLY OF PRINTED WIRING BOARD ELEMENTS

(75) Inventors: Brian E. Curcio, San Diego, CA (US); Donald S. Farquhar, Endicott, NY (US); Lisa J. Jimarez, Newark Valley, NY (US); Keith P. Brodock, Endwell, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/285,162

(22) Filed: Oct. 30, 2002

(51) Int. Cl.[7] .................................................. B32B 3/00
(52) U.S. Cl. ...................... 428/209; 428/344; 428/901; 174/255; 174/264
(58) Field of Search .................. 174/255, 264; 428/352, 354, 355 RA, 344, 355 EP, 209; 439/544, 572

(56) References Cited

U.S. PATENT DOCUMENTS

| | | | |
|---|---|---|---|
| 5,057,372 A | 10/1991 | Imfeld et al. | 428/412 |
| 5,468,681 A * | 11/1995 | Pasch | 437/183 |
| 5,567,329 A | 10/1996 | Rose et al. | 216/18 |
| 6,138,350 A | 10/2000 | Bhatt et al. | 29/852 |
| 6,163,957 A | 12/2000 | Jiang et al. | 29/852 |
| 6,258,627 B1 * | 7/2001 | Benenati et al. | 438/108 |
| 6,326,555 B1 * | 12/2001 | McCormack et al. | 174/255 |
| 6,440,542 B1 | 8/2002 | Kariya | 428/209 |
| 6,465,084 B1 * | 10/2002 | Curcio et al. | 428/209 |
| 6,504,111 B2 * | 1/2003 | Curcio et al. | 174/264 |

FOREIGN PATENT DOCUMENTS

JP   2000165050 A   12/2000

* cited by examiner

Primary Examiner—Cathy Lam
(74) Attorney, Agent, or Firm—William N. Hogg

(57) ABSTRACT

A method of forming a member for joining to form a composite wiring board. The member includes a dielectric substrate. Adhesive tape is applied to at least one face of said substrate. At least one opening is formed through the substrate extending from one face to the other and through each adhesive tape. An electrically conductive material is dispensed in each of the openings and partially cured. The adhesive tape is removed to allow a nub of the conductive material to extend above the substrate face to form a wiring structure with other elements.

9 Claims, 8 Drawing Sheets

METHOD AND STRUCTURE FOR PRODUCING Z-AXIS INTERCONNECTION ASSEMBLY OF PRINTED WIRING BOARD ELEMENTS

CROSS REFERENCE TO RELATED APPLICATIONS

U.S. patent application Ser. No. 09/834,281, filed Apr. 12, 2001, now U.S. Pat. No. 6,465,084B2; and a division thereof, U.S. patent application Ser. No. 10/213,646, filed Aug. 6, 2002, both of which are incorporated herein by reference.

BACKGROUND INFORMATION

1. Field of the Invention

This invention relates generally to a method and structure for producing a Z-axis interconnection of printed wiring board and chip carrier elements and, more particularly, to a method of providing a printed wiring board or chip carrier formed of a plurality of elements which are laminated together to form a printed wiring board or chip carrier having Z-axis interconnections.

2. Background of the Invention

Printed wiring boards and chip carriers are conventionally made up of a plurality of individual elements joined together to provide various levels of wiring on the surfaces of the elements and interconnections between the various wiring levels, such interconnection between the various levels often being referred to as Z-axis interconnections. In some conventional techniques for forming such interconnections in the Z-axis, a drilling operation is required after the various elements have been joined together. This requires precise alignment of all of the elements, as well as precise drilling of the final structure, which creates the possibility of misalignment, at least requiring either rework of the board or, at most, scrapping of the board after it reaches this late assembly stage. Moreover, the z-interconnection provides a more efficient utilization of space on the circuit board compared to conventional through hole drilling. Thus, it is desirable to provide elements for forming a printed wiring board or chip carrier and a technique for forming the elements in the printed wiring board or chip carrier which does not require drilling in the final stage but, rather, allows the individual elements to be formed with the components of the Z-axis connection which, when finally joined together, will provide the necessary connection between various layers of metal wiring.

SUMMARY OF THE INVENTION

According to the present invention, a method of forming a member for a composite wiring board or chip carrier and a method of forming the composite wiring board or chip carrier, as well as the member of the composite wiring board or chip carrier, are provided. The member is formed by providing a dielectric substrate having opposite faces and optionally forming an electrically conductive coating on at least one face thereof, preferably by laminating copper on the at least one face. At least one electrical conductive coating, if provided, is circuitized, preferably at this stage, but later if desired. At least one layer of adhesive film or tape is applied over at least one face. At least one opening is formed through the substrate extending from one face to the other and through each conductive coating, if present, and through each layer of adhesive film or tape. Openings to form one or more blind vias may also be formed. An electrically conductive material is dispensed in each of the openings, including through the openings in the adhesive film or tape. The conductive material is then partially cured. Alternately, a solder paste could be deposited in the holes and then reflowed in an oven. Each layer of adhesive film or tape is then removed to allow a nub of the conductive material to extend above the substrate face, and any remaining conductive material, if any, to thereby form a member that can be electrically joined face-to-face with another member or other circuitized structure. In one embodiment, another member is then formed in a similar manner and the two members joined face-to-face to provide a printed wiring board with electrical interconnections in the Z-axis, i.e. between the circuit traces on opposite faces of the circuit board so formed. In another embodiment, the member is used to join with at least one other circuitized member. The invention also contemplates a member formed according to this invention and a printed wiring board formed using at least one member, either as a circuitized member or as a joining member.

DESCRIPTION OF THE PREFERRED EMBODIMENTS

Figure 1:
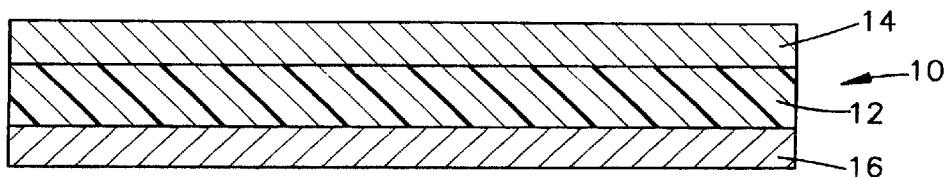
FIGS. 1–6 show a longitudinal, sectional view, somewhat diagrammatic, of the steps to form a core member according to one embodiment of the present invention.

Referring now to the drawings and, for the present, to FIGS. 1–6, the successive steps in forming a core member 10 for use in laminating to another core member to form a printed wiring board according to one embodiment of the invention are shown. As can be seen in FIG. 1, the core member 10 includes a dielectric substrate 12 which has layers of metal coatings 14 and 16 on opposite faces thereof. Dielectric substrate 12 can be any conventional dielectric, such as FR4 (a glass reinforced epoxy), polyimide, polytetrafluroroethylene or other suitable well known dielectric. In the embodiment shown in FIGS. 1–6, the metal coatings 14 and 16 preferably are copper and, typically, the layer is either one-half ounce copper (17.5 um), one ounce copper (35 um thick) or two ounce copper (70 um thick). However, other thicknesses of copper coatings can be used.

Figure 2:
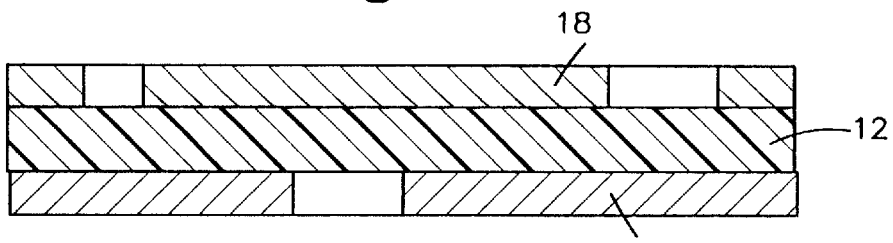

As shown in FIG. 2, preferably the copper layer 14 is patterned to form circuit traces 18 and the copper layer 16 is patterned to form circuit traces 20. Any conventional patterning process, such as by using a photoresist, exposing, developing and etching the exposed areas and then stripping the photoresist can be used.

Figure 3:
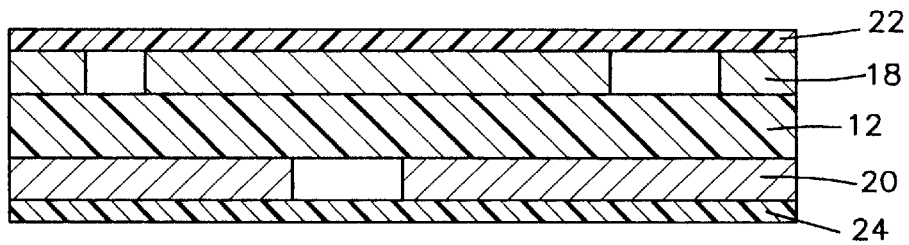

As shown in FIG. 3, a film in the form of adhesive tape 22 is applied over the circuit traces 18 and the same type of film is applied over the circuit traces 20. A particularly useful adhesive tape is a polyimide having a silicone adhesive. This is available from Dielectric Polymers, Inc. of Holyoke, Mass. This tape must be compatible with the conductive material and processes associated with the formatting of the core, which will be described presently. Other types of film material may be used, such as plating tapes NT-S80, 582, 583, 590 and 590-2 manufactured by Dielectric Polymers, Inc. The tape 22 and 24 should be of a thickness equal to the height that it is desired to have the conductive material extend above the circuit traces 18 and 20. If a single layer of tape is not sufficient, multiple layers may be used.

Figure 4:
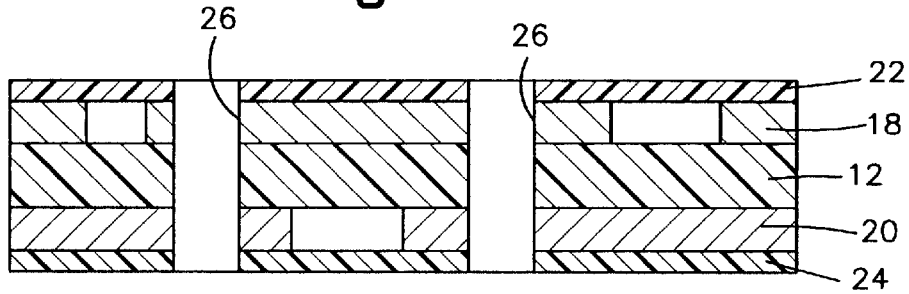

Referring now to FIG. 4, a plurality of holes or openings, two of which are shown at 26, are drilled through the entire composite, including the adhesive tape 22 and 24, circuit traces 18 and 20 and the substrate 12. These holes or openings 26 define the location of the conductive interconnect vias that will be formed.

Figure 5:
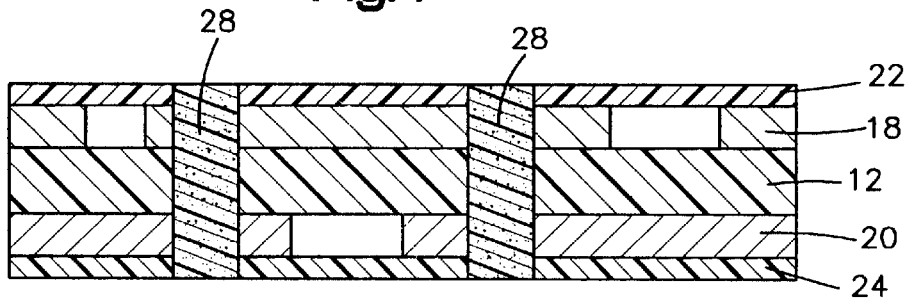

Into the openings 26 is deposited an electrically conductive material 28, as shown in FIG. 5. The filling of these openings 26 can be done by screening, stenciling, flood coating, doctor blading, immersing or injecting. Various types of conductive material may be used. A preferred conductive polymer material is a conductive epoxy sold by National Starch and Chemical Company under the trademark "Ablebond 8175" (This was formerly sold by Ablestik Corporation). "Ablebond 8175" is a silver filled thermosetting epoxy. Following the filling of the holes 26, as shown in FIG. 5, the epoxy is B-staged which entails heating the material to a temperature of about 130° C. until the degree of cure is advanced from about 20% to about 80% complete cure. As will become apparent later, the film material should not be fully cured at this stage since it will be used to adhere to another conductive epoxy in another core element. Alternatively, a solder paste of tin lead, tin lead silver, tin silver copper, tin silver copper antimony or tin bismuth, which are commercially available, can be used and heated to reflow.

Figure 6:
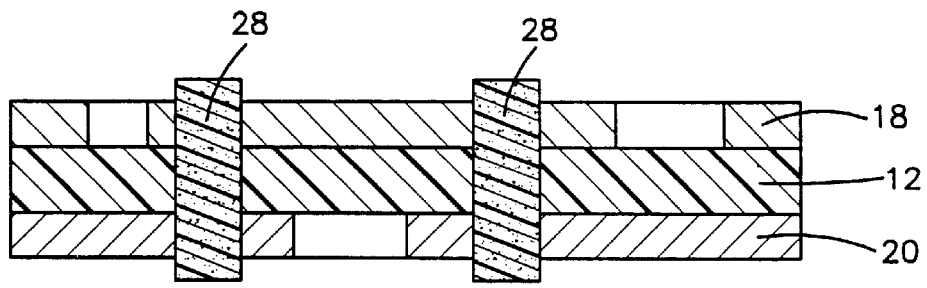

After the conductive material 28 is partially cured, the adhesive tape 22 and 24 is removed to provide the structure shown in FIG. 6. As can be seen in FIG. 6, the partially cured conductive material 28 extends above the circuit traces 18 and 20 a distance equal to the thickness of the adhesive tape 22 and 24.

If the copper layers 14 and 16 have not been previously patterned, that can be done at this point. However, in general, it is preferred that the patterning to form the circuit traces 18 and 20 be done, as shown in FIG. 2, at that stage in the process so that the conductive material 28 is not subjected to the harsh chemical processes normally encountered in patterning material.

Figure 7:
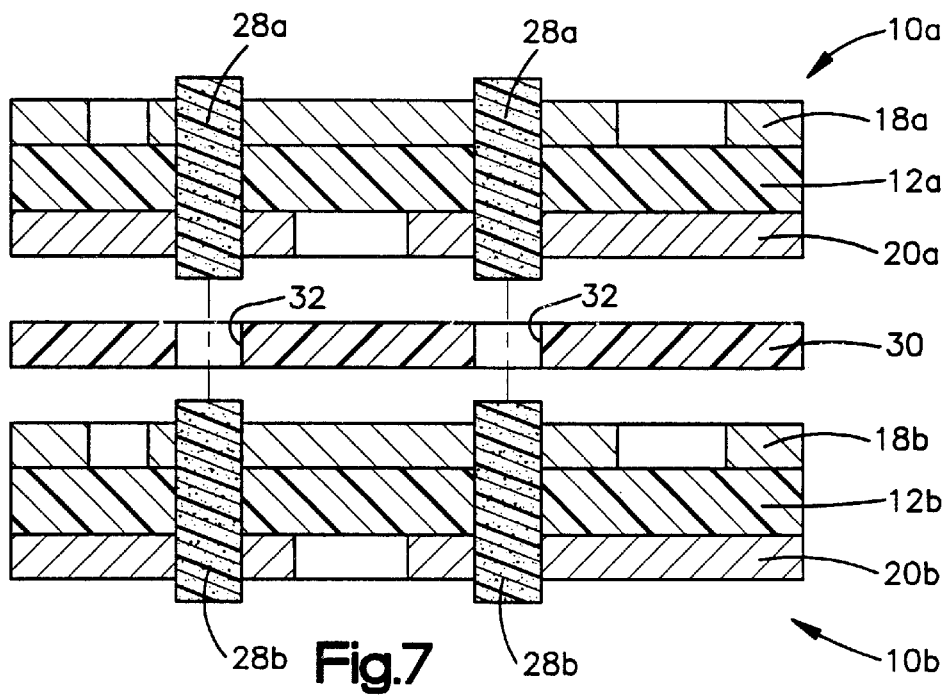
FIGS. 7 and 8 show the steps of laminating two core members together to form a printed wiring board according to one embodiment of the invention.
Figure 8:
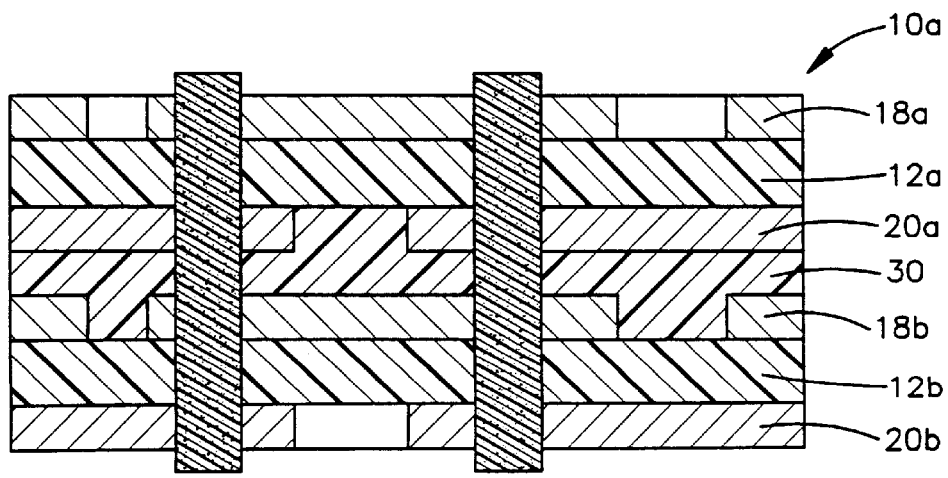
Figure 9:
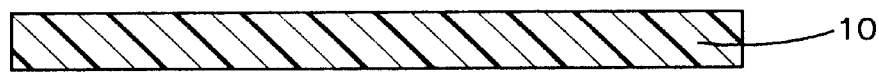
FIGS. 9–13 show a longitudinal, sectional view, somewhat diagrammatic, of the steps to form a joining member according to another embodiment of the present invention.
Figure 10:
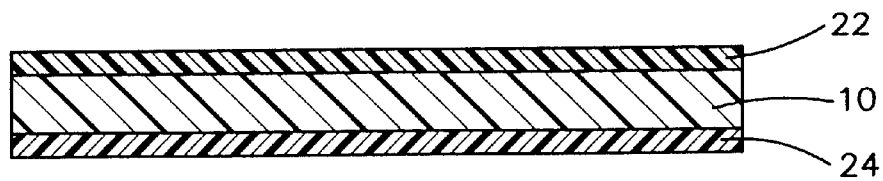

As can be seen in FIG. 7, two core elements 10a and 10b are provided which are to be laminated together. It will be noted that the two core elements 10a and 10b are very similar except that the circuit traces on each of them is slightly different. (In describing the embodiments of FIGS. 7 and 8, the letter suffixes a and b are used to denote similar structures in each core element.) As seen in FIG. 7, a pre-drilled adhesive bonding film 30, such as the film sold under the trademark Pyralux LF by Pyralux Corporation, is interposed between the two cores 10a and 10b. The film 30 has openings 32 drilled therein which are positioned to align with the conductive fill material 28a, 28b in the two core elements 10a and 10b. Heat and pressure are applied as represented by the arrows in FIG. 8 to cause the two core members to bond together, with the Pyralux LF film acting as an adhesive bond material. Also, the fill material 28a and 28b in each of the openings in the two core members 10a and 10b will bond together, as shown in FIG. 8, to form a continuous Z-axis electrical connection between the circuit traces 18a, 18b, 20a and 20b on the core element 10a and 10b. Also, the material of the adhesive bonding film 30 will fill around the circuit traces 18b and 20a. The lamination process also advances the cure of the conductive fill material 28a and 28b past 80% to the fully cured stage. As an alternative, a specially formulated dicing tape can be used as adhesive tape 22. An example of suitable dicing tape is Adwill D-series tape provided by Lintec Corporation. These tapes are comprised of a base material, such as PVC (poly vinyl chloride), or PET (polyethylene terephthalate), or PO (polyolefin) with an adhesive film that provides strong temporary adhesion. Alternately, the adhesive could be provided on other base material, such as polyimide. The adhesive layer provided on the base layer is formulated so that it provides strong initial adhesion but, upon exposure to UV (ultraviolet) radiation, its adhesion is diminished and it can be peeled and released without causing damage or leaving residue on the copper traces 18 or the dielectric layer 12. In such case, the backing must be transparent to UV radiation. Also, it is to be understood that the tape, 22, 24 does not need to be a dielectric. For example, a metal foil with an adhesive on one side could be used. This also constitutes a "tape". (Alternatively, the adhesive bonding film material 30 could be a dry film epoxy adhesive which is B-staged, or other film type adhesive dielectric layers and used to laminate the core elements 10a and 10b together.)

Referring now to FIGS. 9–13, another embodiment of the present invention is shown which is useful in forming a joining member. A substrate 10 is provided which is preferably an adhesive dielectric material. For example, this could be an adhesive coated film (such as duPont Pyralux LF, which is a modified acrylic adhesive on a polyimide film) or a B-staged thermoset adhesive (such as IBM Driclad glass reinforced high glass transition dielectric material), or other film type adhesive dielectric layers, including materials such as Rogers 2800 Silica filled polytetrafluoroethylene.

Figure 11:
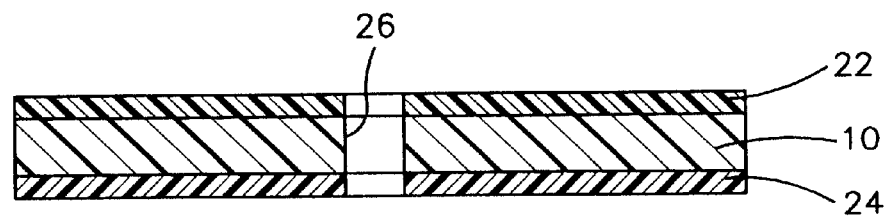
Figure 12:
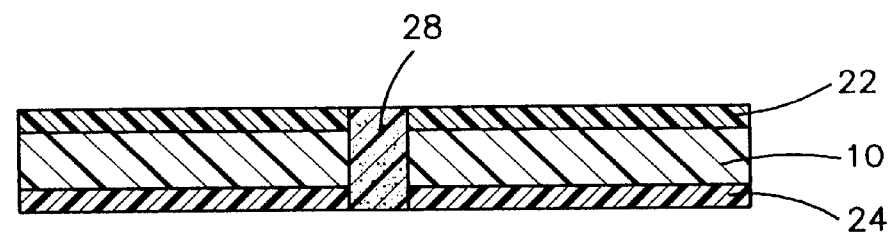
Figure 13:
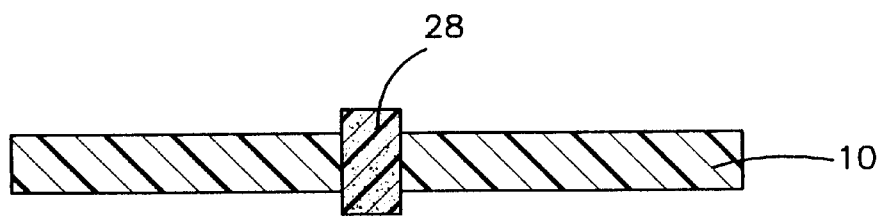

A plurality of holes, one of which is shown at 26, is either mechanically or laser drilled through the substrate 12 and through both of the tapes 22 and 24, as shown in FIG. 11. A conductive material 28 of the same type as described with respect to FIGS. 1–6 is deposited in the hole 26 by the same techniques as previously described with respect to FIGS. 1–6. After the conductive material 28 is remelted or cured, as previously described, the adhesive tapes 22 and 24 are removed to provide a joining member, as shown in FIG. 13.

Figure 14:
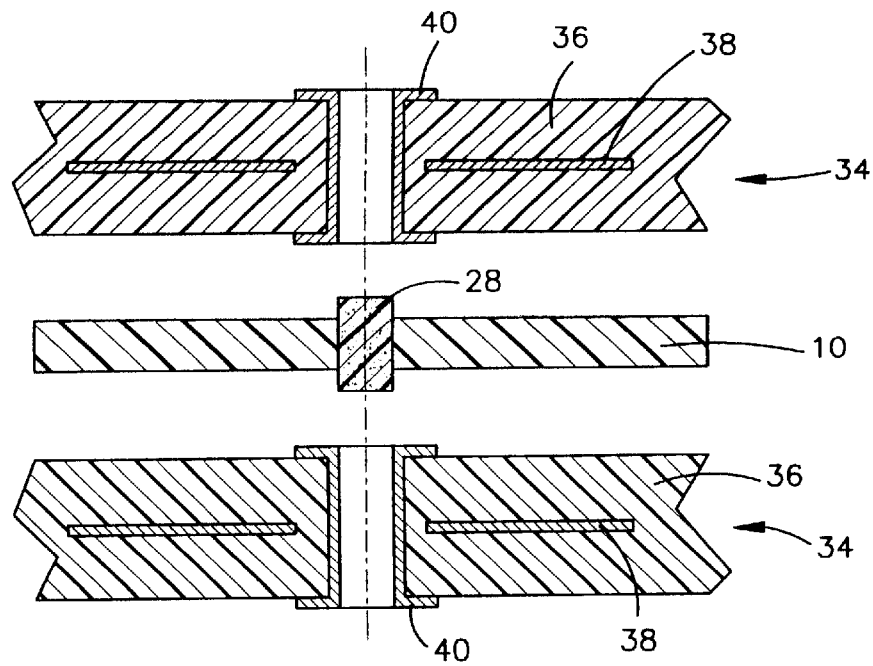
FIGS. 14 and 15 show the steps of laminating two core members together using a joining member formed according to this invention.
Figure 15:
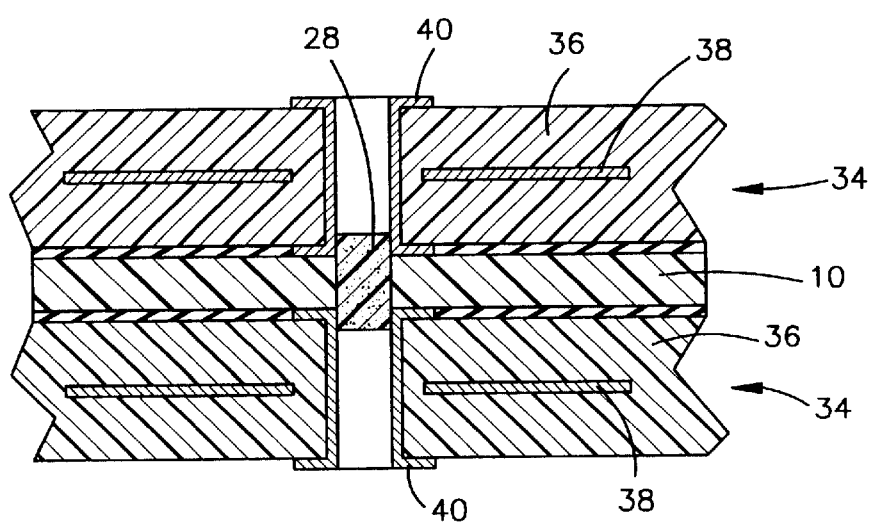

As shown in FIGS. 14 and 15, a joining member formed according to FIGS. 9–13 is used to join two printed wiring boards 34. The dielectric substrate 12 is adhesive acting as a bonding member. Typically, the printed wiring boards will have a dielectric substrate 36 with a plurality of internal conductive planes, one of which is shown at 38, and plated through holes 40. However, this is just illustrative as the joining member can be used to join many different types of printed wiring boards, the boards shown in FIGS. 14 and 15 being merely illustrative.

Figure 16:
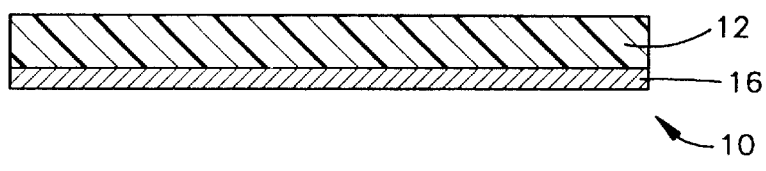
FIGS. 16–20 show longitudinal, sectional views, somewhat diagrammatic, of the steps to form a chip carrier using the blind via embodiment of the present invention.
Figure 17:
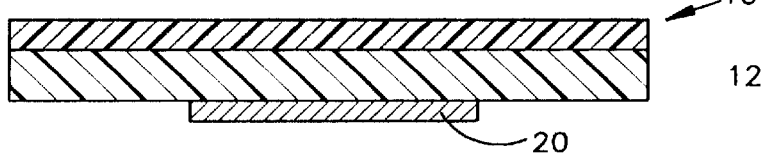

FIGS. 16–20 show an embodiment of the invention which provides members that can be laminated to form a chip carrier. In this embodiment, member 10 is shown in FIG. 16 which includes a dielectric substrate 12 having a conductive metal coating 16 thereon. The substrate 12 is preferably an adhesive of the type described with respect to FIGS. 9–13. The conductive metal coating 16 shown in FIG. 16 is patterned to form either a chip pad or interconnect 20, as shown in FIG. 17. Also, an adhesive tape 22 is applied to the opposite side of the substrate 12 from which the patterned metal 20 is adhered.

Figure 18:
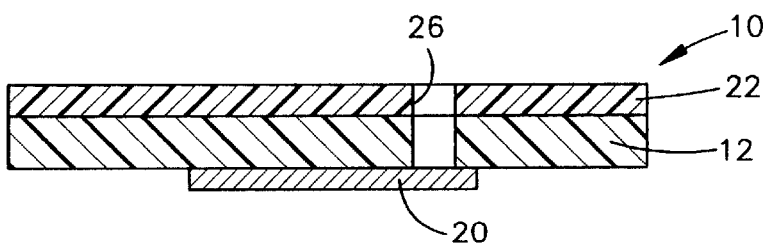
Figure 19:
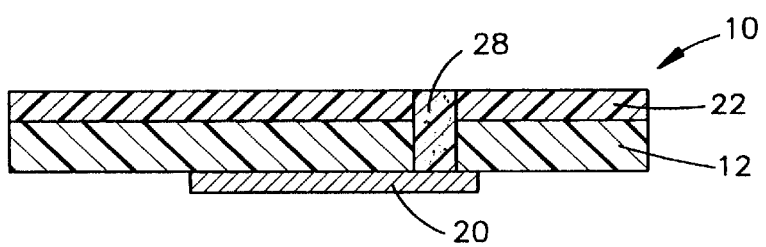
Figure 20:
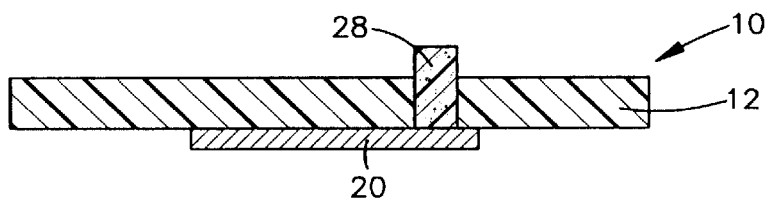

As shown in FIG. 18, holes, one of which is shown at 26, are drilled through both the tape 22 and the substrate 12 terminating at the patterned metal 20. This hole 26 is then filled with conductive material 28 of the type previously described, as shown in FIG. 19, and then the conductive material is heated, as previously described, and the tape 22 is removed to provide the structure shown in FIG. 20.

Figure 21:
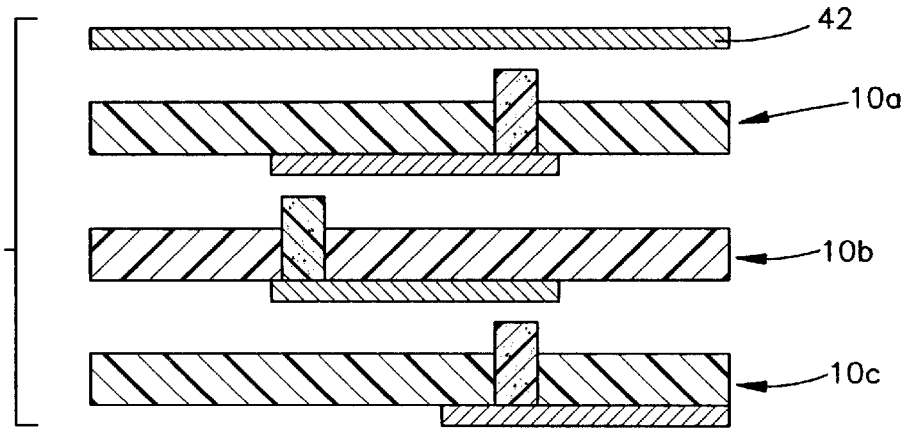
FIGS. 21 and 22 show the steps of laminating three members together to form a chip carrier.
Figure 22:
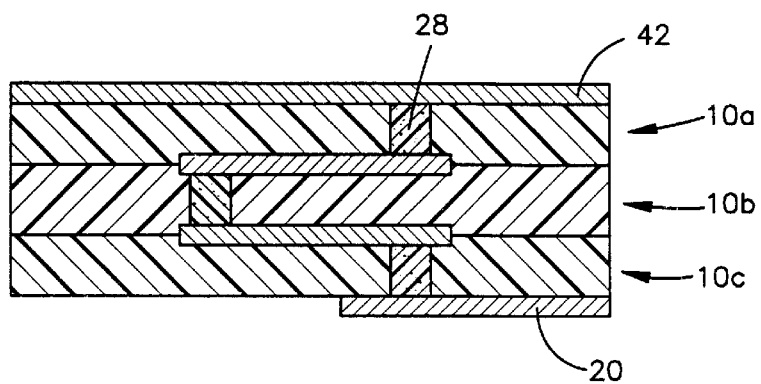
Figure 23:
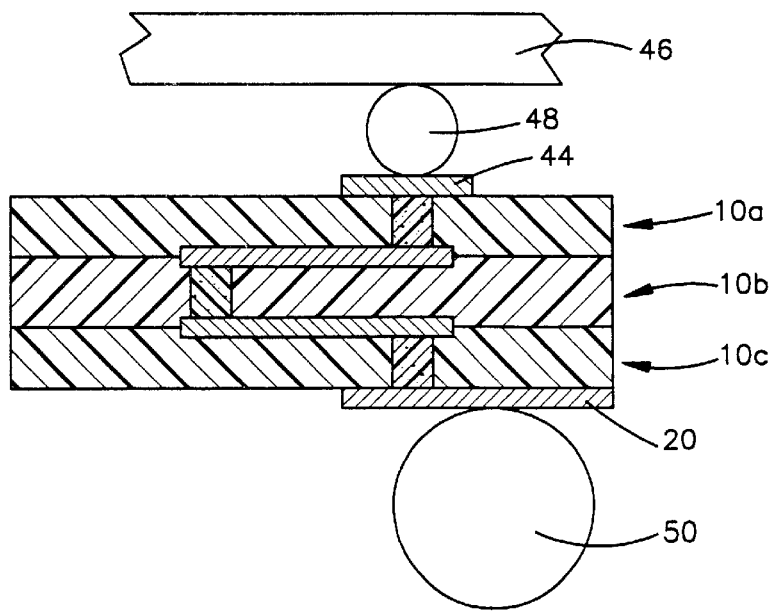
FIG. 23 shows diagrammatically the use of the chip carrier formed in FIGS. 20, 21 and 22 to mount a chip and to mount the carrier to a substrate using, respectively, C4 and ball grid array technology.
Figure 24:
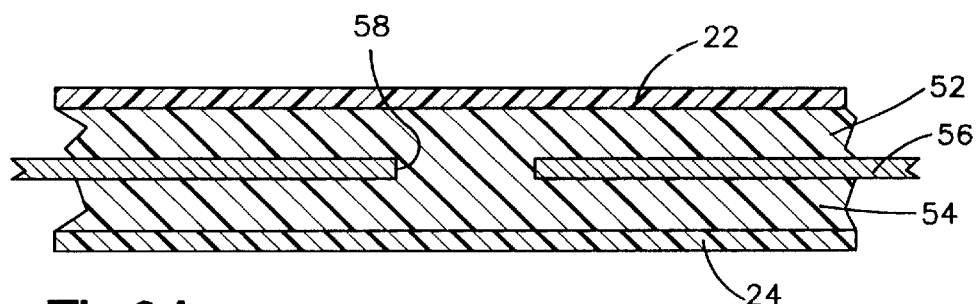
FIGS. 24–27 show a longitudinal, sectional view, somewhat diagrammatic, of the steps to form a joining member with internal power planes.
Figure 25:
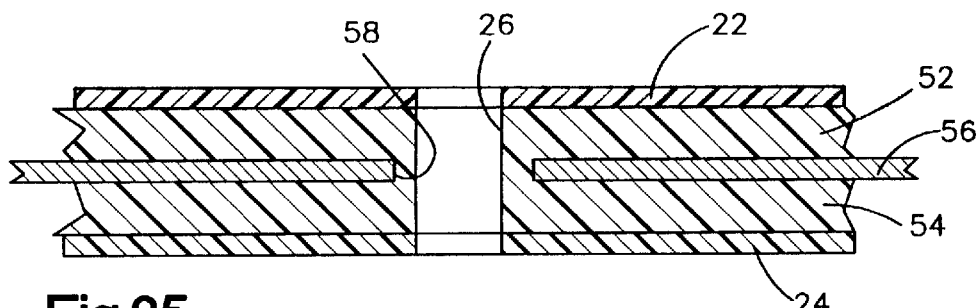

As shown in FIGS. 21 and 22, several of these members 10a, 10b and 10c are laminated together to form a chip carrier with the substrates material of 10a, 10b, and 10c filling around the circuit traces on 10a and 10b. A coating of copper 42 is laminated on top of the member 10a, as shown in FIG. 22. This copper layer 42 is then patterned to form a pad 44 which can serve as a mounting pad for chip 46 mounted thereto by a C-4 joint 48. The pad 20 on the bottom of member 10c can be used to join the chip carrier to a circuit board (not shown) using solder ball technology, one of which is shown at 50.

Figure 26:
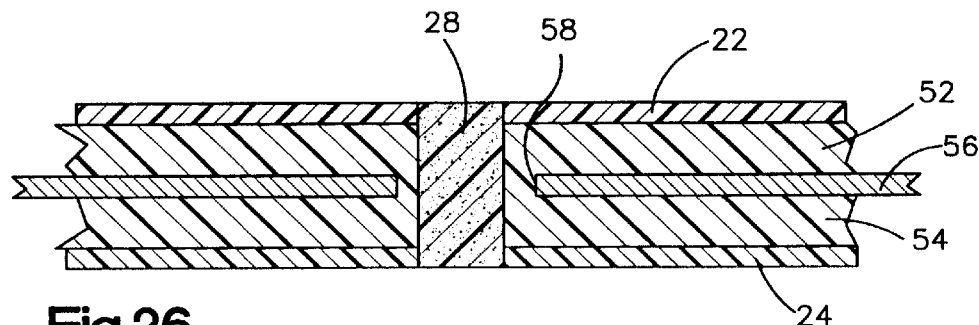
Figure 27:
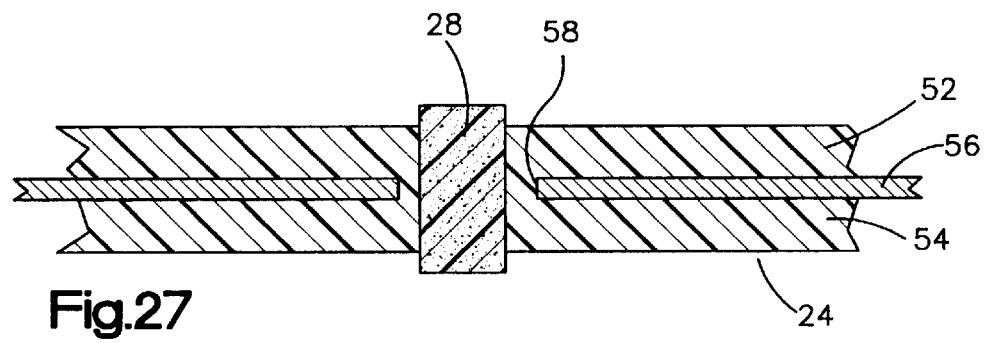
Figure 28:
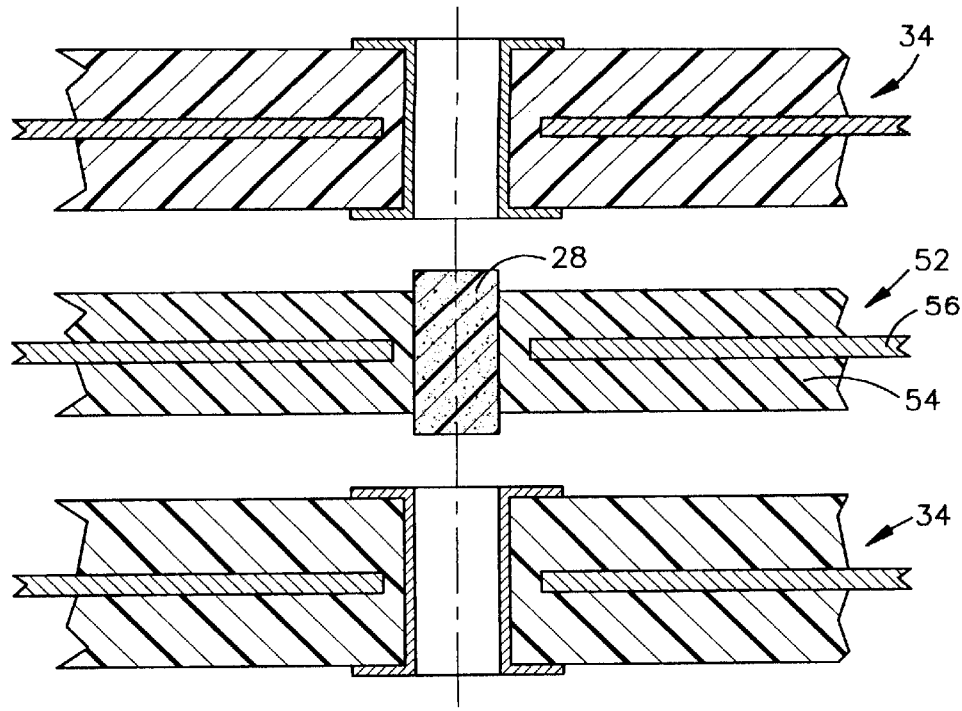
FIGS. 28 and 29 show the steps of laminating two core members together using the joining member formed according to FIGS. 24–27.
Figure 29:
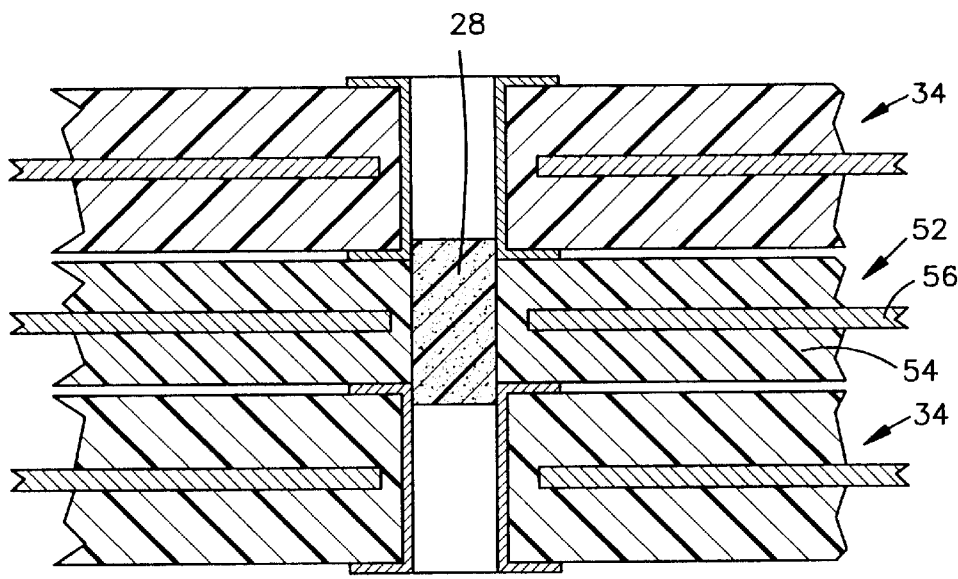

Referring now to FIGS. 24–27, an embodiment is shown for forming a joining member with internal conductive planes. In this embodiment, member 52 includes a dielectric substrate 54 having a metal plane 56 embedded therein which can be a power or ground plane. The substrate 54 again preferably is adhesive, such as shown and described in FIGS. 9–13. Adhesive tape 22 and 24 is applied to opposite sides of the substrate 54 and again a plurality of holes, one of which is shown at 26, are drilled through both of the tapes 22 and 24 and the substrate 54 and opening 58 in plane 56. As in the previous embodiments, a conductive material 28 is deposited in the hole 26 and cured or otherwise heated, as shown in FIG. 26. The tape is then removed to provide the structure shown in FIG. 27. This joining structure can be used to join two printed wiring boards 34, as shown in FIGS. 28 and 29.

While the invention has been described in conjunction with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. An intermediate structure for a member for joining to at least one additional structure to form a composite structure comprising:

a dielectric substrate having first and second opposite faces;

a layer of adhesive tape overlying at least one face;

at least one opening extending through said substrate and said adhesive tape, and a continuous electrically conductive material without longitudinal interface disposed in each of said openings.

2. The invention as defined in claim 1 wherein said electrically conductive material is an electrically conductive adhesive.

3. The invention as defined in claim 1 wherein said electrically conductive material is a filled thermoset or thermoplastic polymer.

4. The invention as defined in claim 1 wherein said electrically conductive material is a filled polymer.

5. The invention as defined in claim 3 wherein the polymer is a thermoset polymer and is cured to between about 20% and about 80% of complete cure.

6. The invention as defined in claim 1 wherein the material is a filled epoxy.

7. The invention as defined in claim 1 wherein conductive traces are formed on at least one face of said substrate and said openings extend therethrough.

8. The invention as defined in claim 7 wherein a nub of said electrically conductive material extends beyond the conductive traces.

9. The invention as defined in claim 7 wherein a nub of said electrically conductive material contacts said electrically conductive traces.

* * * * *